United States Patent [19]
Ishizu et al.

[11] Patent Number: 4,984,033
[45] Date of Patent: Jan. 8, 1991

[54] THIN FILM SEMICONDUCTOR DEVICE WITH OXIDE FILM ON INSULATING LAYER

[75] Inventors: Akira Ishizu, Amagasaki; Tadashi Nishimura; Yasuo Inoue, both of Itami, all of Japan

[73] Assignee: Mitsubishi Denki Kabushiki Kaisha, Japan

[21] Appl. No.: 287,146

[22] Filed: Dec. 21, 1988

Related U.S. Application Data

[62] Division of Ser. No. 30,904, Mar. 31, 1987, Pat. No. 4,822,251.

[30] Foreign Application Priority Data

Apr. 2, 1986 [JP] Japan .................................. 61-77413

[51] Int. Cl.$^5$ ............................................ H01L 33/00
[52] U.S. Cl. ..................................... 357/17; 357/23.7; 357/59; 357/2; 350/338; 350/336; 350/339 R; 350/342
[58] Field of Search ....................... 357/17, 30 I, 30 H, 357/30 K, 30 L, 30 G, 23.7, 59 G, 2; 350/338, 336, 339 R, 342

[56] References Cited

U.S. PATENT DOCUMENTS

| | | | |
|---|---|---|---|
| 4,409,605 | 10/1983 | Ovshinsky et al. | 357/2 |
| 4,636,038 | 1/1987 | Kitahara et al. | 350/339 R |
| 4,737,712 | 11/1988 | Ukai et al. | 350/339 R |
| 4,810,060 | 3/1989 | Ukai | 350/339 R |
| 4,834,507 | 5/1989 | Kato et al. | 357/23.7 X |
| 4,885,616 | 12/1989 | Ohta | 357/23.7 |

FOREIGN PATENT DOCUMENTS 5329751   3/1978   Japan .................................. 350/339 R

OTHER PUBLICATIONS

Ishizu et al., "Direct Pattern Writing of Silicon by Argon Laser Induced CVD", *Proceedings of Symposium on Dry Process*, (Oct. 24–25, 1985), Tokyo, pp. 13–18.
Baverle et al., "Ar+ Laser Induced Chemical Vapor Deposition of Si from SiH4", *Applied Physics Letters*, 40(9), May 1, 1982, pp. 819–821.
Coblenz, "Semiconductor Compounds", *Electronic Buyers' Guide*, Jun. 1958-Mid-Month, pp. R4–R5.

*Primary Examiner*—William Mintel
*Attorney, Agent, or Firm*—Saidman, Sterne, Kessler & Goldstein

[57] ABSTRACT

A thin film semiconductor device is formed by preparing a substrate, forming a pattern of metal thin film on the substrate, forming an insulating layer on the metal thin film, and forming a pattern of a semiconductor thin film active layer over the pattern of the metal thin film by laser CVD.

11 Claims, 3 Drawing Sheets

THIN FILM SEMICONDUCTOR DEVICE WITH OXIDE FILM ON INSULATING LAYER

This application is a division, of application Ser. No. 030,904, filed March 31, 1987, now U.S. Pat No. 4,822,751.

BACKGROUND OF THE INVENTION

The present invention relates to a thin film semiconductor device, such as a thin film transistor (TFT) formed on a substrate, such as a transparent substrate, and a method of producing the thin film semiconductor device. More specifically, the invention relates to a new method of forming a semiconductor active layer in such a device.

In recent years, applications of thin film semiconductor devices such as thin film transistors (TFTs) to liquid crystal display devices, three-dimensional circuit devices are studied and developed actively.

In applications of TFTs to liquid crystal display devices, TFTs are incorporated in the respective picture elements (pixels) arranged in a matrix in a liquid crystal display device with a low drive voltage and a small power consumption to obtain a flat display device having a good picture quality. It is expected that the liquid crystal image display device will be wide-spread, replacing CRTs.

FIG. 1 shows an equivalent circuit of one of pixels of a liquid crystal display device. The pixels arranged in a matrix form an image. Each pixel is selected by a gate line 21 for transmitting a scan signal, and a source line 22 for transmitting a video signal. Each pixel comprises a TFT 27 having a gate 25 connected to the gate line 21, a source 23 connected to the source line 22, and a drain 24 connected to a liquid crystal layer 26.

The TFT in such an application is required to have a sufficient large ON current Ion to give a sufficient potential to the liquid crystal layer 26 in a short writing time and a small OFF current Ioff to hold the signal for a period (frame period) of one selection to the subsequent selection.

FIG. 2 shows $I_D$ (drain current)-$V_G$ (gate voltage) characteristic, which is the switching characteristic of the TFT. The characteristic under normal condition is shown by curve 31, with Ioff at 31. When the channel part of the TFT is illuminated by an incident light from the outside, the carriers are excited by the incident light and photo-current flows. The characteristic is therefore as shown by curve 32 with Ioff at 34, higher than 33. With the elevated Ioff, holding the signal for the frame period is difficult and the picture quality of the display becomes poor.

To eliminate the problem, TFTs are provided with an incident light shielding layer.

FIG. 3 shows an example of a conventional TFT. A transparent substrate 1 may be of quartz, on which an incident light shielding layer 2 is formed by, for example, first depositing by sputtering or the like a thin film of chrome or the like and paterning the thin film by photolithography and etching. An insulating layer 3 of silicon oxide film or the like is formed over the entire surface of the incident light shielding layer 2. A polysilicon layer 4 is then deposited over the entire surface by reduced pressure CVD (chemical vapor deposition). The polysilicon layer is then subjected to complicated photolithography, and selective oxidation to be formed into an active layer 6 in an island form. To improve the performance of the TFT, the active layer 6 is re-crystalized by argon laser. FIG. 3 also shows a gate oxide film 8, a gate 9 formed, for instance, of polysilicon, a source electrode 10, a drain electrode 11, oxide film 5, and a gate electrode 12.

To form the TFT with improved performance, the incident light shielding layer 2 must first be formed by photolithography and etching, and then the semiconductor active layer must be formed by even more complicated photolithography and selective oxidation. Moreover, the laser recrystalization process is conducted to improve the performance. Thus the process of fabrication is complicated.

SUMMARY OF THE INVENTION

An object of the invention is to enable production of a TFT and other thin film semiconductor devices with an improved characteristic by a simpler process.

According to a first aspect of the invention, there is provided a thin film semiconductor device comprising a semiconductor thin film active layer, and a metal thin film formed on a substrate, the metal thin film having a pattern corresponding to the pattern of the semiconductor active layer, the semiconductor active layer being formed selectively over the metal thin film by laser CVD.

According to a second aspect of the invention there is provided a thin film semiconductor device comprising a semiconductor thin film active layer, a metal thin film formed on a transparent substrate to have a pattern corresponding to the pattern of the semiconductor thin film active layer, and a silicon oxide film formed on the metal thin film, the semiconductor thin film active layer being formed selectively over the metal thin film by laser CVD using argon laser light.

According to a third aspect of the invention, there is provided a method of producing a thin film semiconductor device comprising the steps of
preparing a substrate,
forming a pattern of metal thin film on the substrate,
forming an insulating layer on the metal thin film, and
forming a pattern of a semiconductor thin film active layer over the pattern of the metal thin film by laser CVD.

By use of the selective laser CVD on the metallic thin film to form a semiconductor thin film which is used as the active layer, complicated photolithograply, selective oxidation, laser recrystalization and the like are no longer necessitated.

DETAILED DESCRIPTION OF THE PREFERRED EMBODIMENTS

Figure 1:
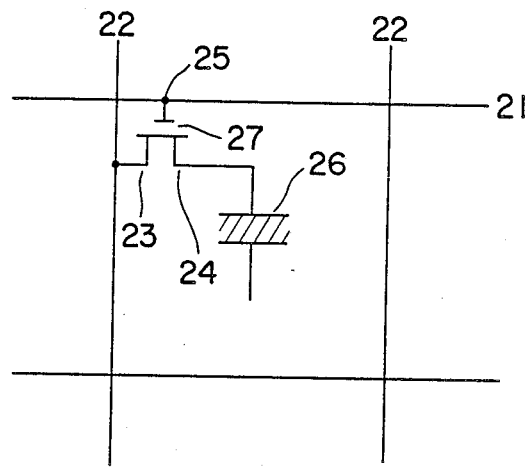
FIG. 1 is a diagram showing an equivalent circuit of part of a liquid crystal display device incorporating a TFT.
Figure 2:
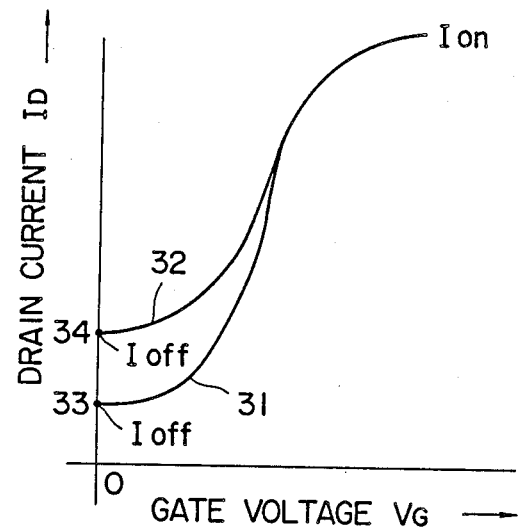
FIG. 2 is a diagram showing $I_D$-$V_a$ characteristics illustrating the switching characteristics.
Figure 3:
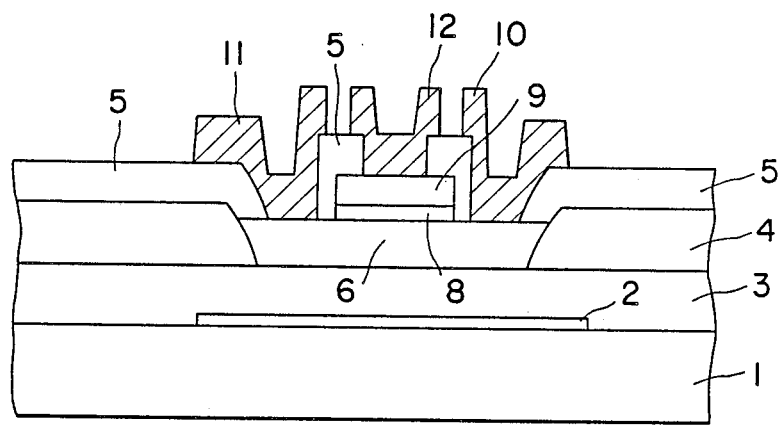
FIG. 3 is a sectional view showing the structure of an example of a conventional TFT.
Figure 4:
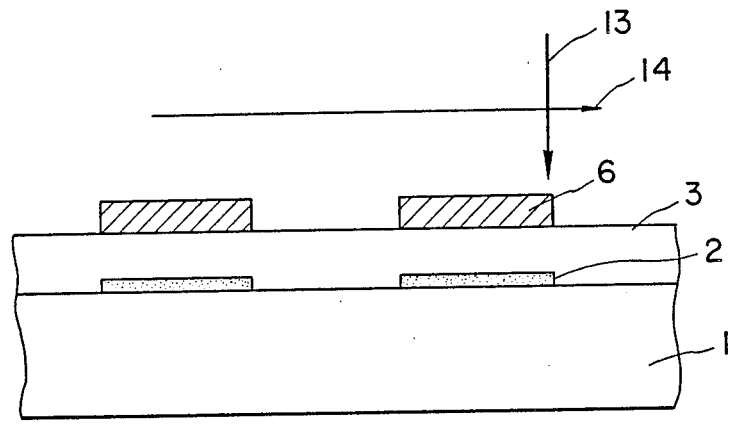
FIG. 4 is a sectional view showing a production step of a TFT of an embodiment of the invention.

FIG. 4 shows production of a TFT of an embodiment of the invention, particularly how an incident light shielding layer and the semiconductor active layer are formed.

First, a transparent substrate 1 of quartz or the like is prepared. Then a thin film of chrome or the like is formed on the entire surface by sputtering or the like. The thin film is then patterned by photolithography and etching to have a form of island as indicated by reference numeral 2. An insulating layer 3 of silicon oxide or the like is deposited on the entire surface.

The substrate with the above-described layers are then placed in a chamber of an SiH4 atmosphere or the like and is illuminated by an argon laser light beam 13 normal to the substrate surface and scanning in the direction 14 parallel to the substrate surface. The illuminating laser light 13 is absorbed by the thin film layer 2 and generates heat, which conducts through the insulating layer 3, and heats and dissolves the SiH4 gas near the surface of the insulating layer 3, so that silicon 6 is selectively deposited on the surface directly over the thin film layer 2. In other words, the silicon layer 6 is formed over the metal layer 2 in a self alignment manner. The layer 2 is so formed that its pattern corresponds to the desired pattern of the layer 6.

It has been confirmed that the silicon formed on a silicon oxide film by laser CVD using argon laser light is crystalized (Ishizu, et at.; 7th Dry Process Symposium I-3, 1985-10). The metallic film 2 and the crystalized silicon layer 6 thus formed can be utilized as the incident light shielding layer and the semiconductor active layer, without first being subjected to complicated processing, laser annealing, or the like.

Figure 5:
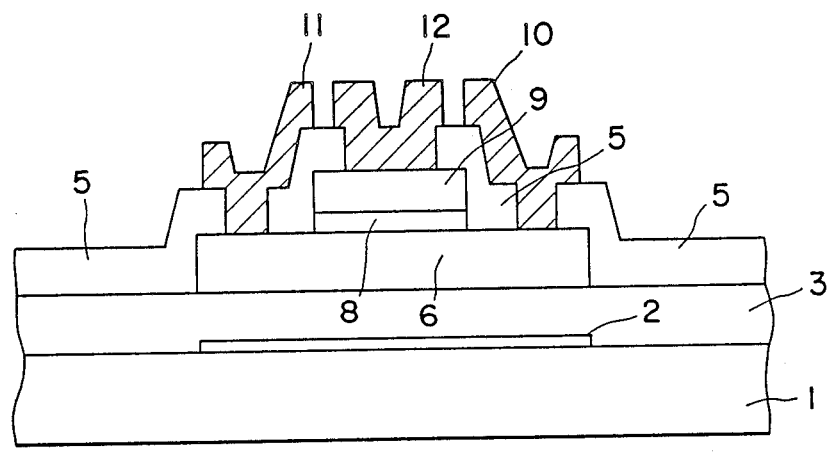
FIG. 5 is a sectional view showing a TFT of an embodiment of the invention.

Further processing may be conducted to form a desired element. To form a TFT, as shown in FIG. 5, a gate oxide film 8, a gate 9 of polysilicon or the like and an oxide film 5 are formed, and a source electrode 10, a drain electrode 11 and a gate electrode 12 of aluminum or the like are formed.

Thus, an incident light shielding layer formed by photolithograply is utilized as a light absorbing layer in laser CVD, and a crystalized silicon layer is formed by self alignment. In this way, the method of the invention eliminates the need to resort to the complicated photolithography, selective oxidation, laser recrystalization and the like which were required in the conventional method, so that fabrication is much simplified, and a TFT or other thin film semiconductor devices with a high performance can be produced.

In the embodiment described above, the TFT is used for switching in a pixel of a liquid crystal display device. The invention is also applicable where the TFT is incorporated in a drive circuit of the liquid crystal display device integrally formed at the periphery of a chip. The TFT according to the invention can also be incorporated in a three-dimensional circuit device, a facsimile reading sensor controller, and other electronic devices.

What is claimed is:

1. A thin film semiconductor device, the thin film semiconductor device having a gate, gate oxide, and source, gate, and drain electrodes, said device comprising:

a transparent substrate;

a light shielding layer formed on the substrate;

an insulating layer formed over said light shielding layer;

a semiconductor active layer formed over said insulating layer;

a gate oxide film formed on the semiconductor active layer;

a gate formed on the gate oxide film;

an oxide film formed directly on the insulating layer, the semiconductor active layer and the gate; and a source electrode and a drain electrode formed on the oxide film and the semiconductor active layer, and a gate electrode formed on the oxide film and the gate.

2. A device according to claim 1, wherein said light shielding layer is formed of a metal film.

3. A device according to claim 1, wherein said insulating layer is formed of silicon oxide.

4. A device according to claim 1, wherein said semiconductor active layer is formed of crystallized silicon.

5. A device according to claim 1, wherein said light shielding layer has a certain pattern; and said semiconductor active layer has a pattern identical to said certain pattern of the light shielding layer.

6. A device according to claim 5, wherein said semiconductor active layer is formed selectively over said light shielding layer by a laser CVD process.

7. A device according to claim 6, wherein, during the laser CVD process for forming the semiconductor active layer, a laser beam is scanned unselectively across the surface of the substrate.

8. A device according to claim 1, wherein the light shielding layer is formed of chrome.

9. A device according to claim 6, wherein the laser CVD process is conducted in an atmosphere of silane.

10. A device according to claim 6, wherein the laser CVD process uses an argon laser.

11. A device according to claim 6, wherein the laser CVD process is conducted in an atmosphere of silane.

* * * * *